United States Patent
Iida (10) Patent No.: US 10,644,691 B2
(45) Date of Patent: May 5, 2020

(54) SEMICONDUCTOR INTEGRATED CIRCUIT

(71) Applicant: SOCIONEXT INC., Kanagawa (JP)

(72) Inventor: Masahisa Iida, Kanagawa (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/165,431

(22) Filed: Oct. 19, 2018

(65) Prior Publication Data
US 2019/0052259 A1 Feb. 14, 2019

Related U.S. Application Data (63) Continuation of application No. PCT/JP2017/006200, filed on Feb. 20, 2017.

(30) Foreign Application Priority Data

Apr. 21, 2016 (JP) ................. 2016-085236

(51) Int. Cl.
*H03K 3/00* (2006.01)
*H03K 17/16* (2006.01)
*H03K 17/687* (2006.01)
*H03K 19/00* (2006.01)
*H03K 3/356* (2006.01)
(Continued)

(52) U.S. Cl.
CPC ..... *H03K 17/162* (2013.01); *H03K 3/356113* (2013.01); *H03K 17/005* (2013.01); *H03K 17/6872* (2013.01); *H03K 17/693* (2013.01); *H03K 19/00* (2013.01); *H03K 19/018521* (2013.01); *H03K 2217/0018* (2013.01)

(58) Field of Classification Search
CPC ....... H03K 19/0013; H03K 19/018521; H03K 19/018528; H03K 19/00315; H03K 3/356113; G11C 8/08; G11C 5/145; G11C 7/12
See application file for complete search history.

(56) References Cited

U.S. PATENT DOCUMENTS 7,855,574 B2 * 12/2010 Santurkar ............ H03K 19/094
326/68
2004/0140841 A1 7/2004 Mitarashi
2015/0171858 A1 * 6/2015 Matsuoka .......... H03K 3/35613
327/109

FOREIGN PATENT DOCUMENTS

JP    2004-228782 A    8/2004
JP    2008-86100 A    4/2008
(Continued)

OTHER PUBLICATIONS

English translation of International Search Report issued in Application No. PCT/JP2017/006200 dated May 16, 2017.

*Primary Examiner* — Long Nguyen
(74) *Attorney, Agent, or Firm* — McDermott Will & Emery LLP (57) ABSTRACT

In order to provide a power supply switch circuit using only low-breakdown voltage transistors and eliminate the need for a special through-current preventing circuit, the switch control circuits output a signal ranging from a ground voltage level to a second power supply voltage level when a first power supply voltage (0 V/3.3 V) is in off-state and a second power supply voltage (0 V/1.8 V) is in on-state, and a signal ranging from the second power supply voltage level to a first power supply voltage level when the first and second power supply voltages are in on-state, thereby allowing a PMOS transistor and an NMOS transistor to turn on or off.

3 Claims, 9 Drawing Sheets

(51) Int. Cl.
*H03K 17/693* (2006.01)
*H03K 17/00* (2006.01)
*H03K 19/0185* (2006.01)

(56) References Cited

FOREIGN PATENT DOCUMENTS

JP 2012-39693 A 2/2012
WO 2014/038115 A1 3/2014

* cited by examiner

SEMICONDUCTOR INTEGRATED CIRCUIT

CROSS-REFERENCE TO RELATED APPLICATION

This is a continuation of International Application No. PCT/JP2017/006200 filed on Feb. 20, 2017, which claims priority to Japanese Patent Application No. 2016-085236 filed on Apr. 21, 2016. The entire disclosures of these applications are incorporated by reference herein.

BACKGROUND

The present disclosure relates to a semiconductor integrated circuit including a power supply switch circuit having a function of switching power supply voltages to be supplied.

In general, a signal frequency is increased in a high-speed interface, and thus, the voltage level of a signal is reduced to reduce an increase in power consumption. For example, while secure digital (SD) cards that comply with the traditional interface standard use a 3.3-V signal interface, SD cards that comply with the state-of-the-art high-speed standard use a 1.8-V signal interface. In the case of interface standards widely accepted such as the Secure Digital standard, devices are required to support both new and old standards, and therefore, interface circuits need to switch signal voltage levels, depending on the standard with which a connected SD card complies. Therefore, a power supply switch circuit is needed which switches power supply voltages, which are to be supplied to the interface circuit, between 3.3 V and 1.8 V.

One conventional technique provides a power supply switch circuit which does not cause an unwanted current, such as the parasitic diode current, even when any of a plurality of power supply voltages is in off-state (see WO2014/038115).

SUMMARY

In the above conventional technique, a voltage of 3.3 V at the maximum is applied across terminals of a metal-oxide-semiconductor (MOS) transistor forming a power supply switch circuit. Thus, the conventional technique utilizes a high-breakdown-voltage MOS transistor, i.e., a 3.3-V breakdown voltage MOS transistor in which, even if any two terminals of four terminals of each transistor are selected, a potential difference between the two terminals is allowed to be up to 3.3 V. This results in increasing cost due to, e.g., increasing a process cost. Although a plurality of external 1.8 V/3.3 V power supplies are used to deal with breakdown voltage, a through-current preventing circuit is needed when power is supplied from only one of the power supplies.

The present disclosure attempts to a technique of providing a power supply switch circuit which does not cause an unwanted current using only an MOS transistor having a low-breakdown-voltage, and eliminating the need for a special through-current preventing circuit.

A semiconductor integrated circuit of the present disclosure includes: a ground terminal to which a ground potential is applied; a first power supply terminal to which a first power supply voltage is applied, the first power supply voltage having a voltage of a ground voltage level equal to the ground potential in off-state, and a voltage of a first power supply voltage level higher than the ground potential in on-state; a second power supply terminal to which a second power supply voltage is applied, the second power supply voltage having the voltage of the ground voltage level in off-state, and a voltage of a second power supply voltage level higher than the ground potential and lower than the first power supply voltage level in on-state; a third power supply terminal through which the first power supply voltage applied to the first power supply terminal or the second power supply voltage applied to the second power supply terminal is output; a P-channel (PMOS) transistor which connects the first power supply terminal and the third power supply terminal together; an N-channel (NMOS) transistor which connects the second power supply terminal and the third power supply terminal together, a first switch control circuit which is connected to a gate of the PMOS transistor; and a second switch control circuit which is connected to a gate of the NMOS transistor, wherein the first switch control circuit outputs a signal ranging from the ground voltage level to the second power supply voltage level when the first power supply voltage is in off-state and the second power supply voltage is in on-state, and a signal ranging from the second power supply voltage level to the first power supply voltage level when the first and second power supply voltages are in on-state, thereby allowing the PMOS transistor to turn on or off, and the second switch control circuit outputs a signal ranging from the ground voltage level to the second power supply voltage level when the first power supply voltage is in off-state and the second power supply voltage is in on-state, and a signal ranging from the second power supply voltage level to the first power supply voltage level when the first and second power supply voltages are in on-state, thereby allowing the NMOS transistor to turn on or off.

A second semiconductor integrated circuit of the present disclosure includes: a ground terminal to which a ground potential is applied; a first power supply terminal to which a first power supply voltage is applied, the first power supply voltage having a voltage of a ground voltage level equal to the ground potential in off-state, and a voltage of a first power supply voltage level higher than the ground potential in on-state; a second power supply terminal to which a second power supply voltage is applied, the second power supply voltage having the voltage of the ground voltage level in off-state, and a voltage of a second power supply voltage level higher than the ground potential and lower than the first power supply voltage level in on-state; a third power supply terminal through which the first power supply voltage applied to the first power supply terminal or the second power supply voltage applied to the second power supply terminal is output; a first PMOS transistor which connects the first power supply terminal and the third power supply terminal together; a second PMOS transistor which connects the second power supply terminal and the third power supply terminal together; a first switch control circuit which is connected to a gate of the first PMOS transistor; and a second switch control circuit which is connected to a gate of the second PMOS transistor, wherein the first switch control circuit outputs a signal ranging from the ground voltage level to the second power supply voltage level when the first power supply voltage is in off state and the second power supply voltage is in on-state, and a signal ranging from the second power supply voltage level to the first power supply voltage level when the first and second power supply voltages are in on-state, thereby allowing the first PMOS transistor to turn on or off, and the second switch control circuit outputs a signal ranging from the ground voltage level to the second power supply voltage level when the first power supply voltage is in off-state and the second power supply voltage is in on-state, and a signal ranging from the ground voltage level to the first power supply voltage level when the first and second power supply voltages are in on-state, thereby allowing the second PMOS transistor to turn on or off.

The present disclosure can provide, in a semiconductor integrated circuit, a power supply switch circuit which does not cause an unwanted current using only an MOS transistor a low-breakdown-voltage, and eliminate the need for a special through-current preventing circuit in the semiconductor integrated circuit.

DETAILED DESCRIPTION

Two embodiments of the present disclosure will be described in detail below, with reference to the drawings.

Each embodiment is described using a semiconductor integrated circuit including a power supply switch circuit switching two power supply voltages, namely, a first power supply voltage VDD1 that is 0 V in off-state and 3.3 V in on-state ("0 V/3.3 V") and a second power supply voltage VDD2 that is 0 V in off-state and 1.8 V in on-state ("0 V/1.8 V"). An internal power supply voltage VDD of the semiconductor integrated circuit is supposed to be 0 V in off-state and 0.9 V in on-state ("0 V/0.9 V").

First Embodiment

Figure 1:
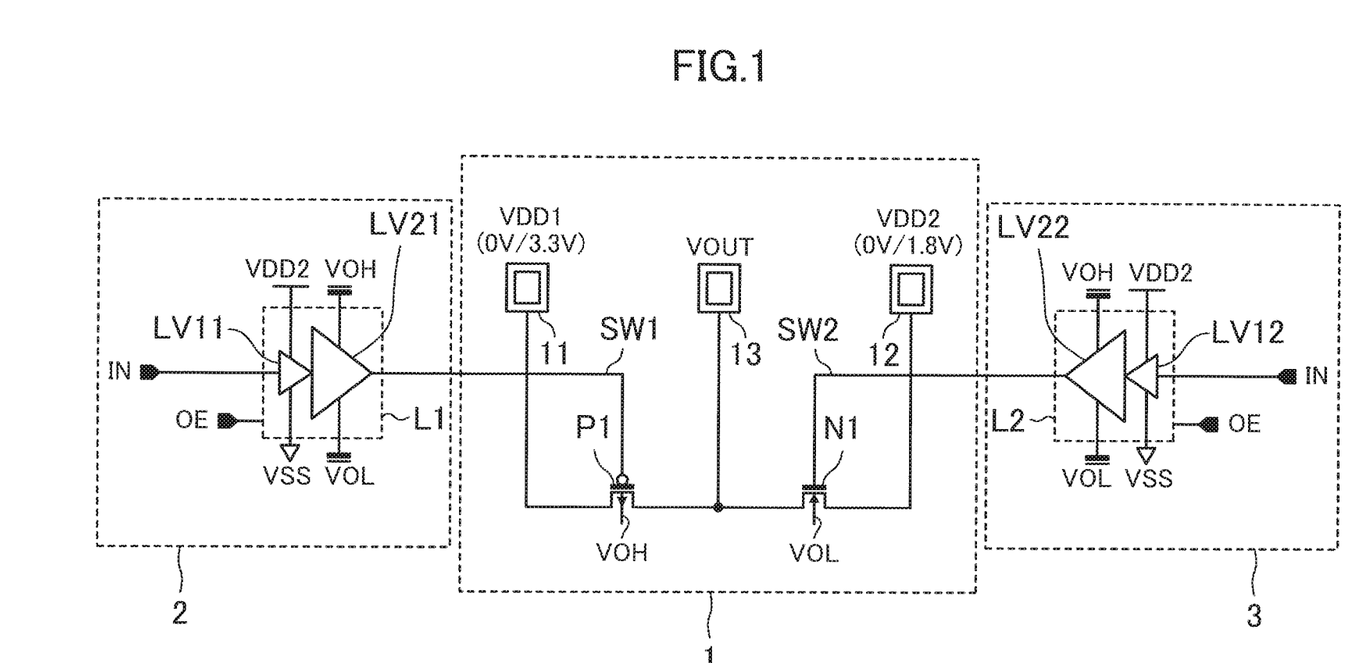
FIG. 1 is a circuit diagram showing a semiconductor integrated circuit according to a first embodiment.

FIG. 1 is a circuit diagram showing a semiconductor integrated circuit according to a first embodiment. The semiconductor integrated circuit of FIG. 1 includes a power supply switch circuit 1, a first switch control circuit 2, and a second switch control circuit 3. In FIG. 1, VOH indicates a higher voltage (a selected higher voltage) of the first power supply voltage VDD1 or the second power supply voltage VDD2, and VOL indicates a lower voltage (a selected lower voltage) of the first power supply voltage VDD1 or second power supply voltage VDD2.

The power supply switch circuit 1 includes: a first power supply terminal 11 to which a first power supply voltage VDD1 is externally applied; a second power supply terminal 12 to which a second power supply voltage VDD2 is eternally applied; a switch circuit which includes a PMOS transistor P1 and an NMOS transistor N1; and a power supply output terminal 13 outputting the first power supply voltage VDD1 or the second power supply voltage VDD2 as a power supply voltage output VOUT. The PMOS transistor P1 has: a source connected to the first power supply terminal 11, a drain connected to the power supply output terminal 13; a gate connected to a first switch control signal SW1 that is an output signal from the first switch control circuit 2; and a backgate connected to the selected higher voltage VOH. The NMOS transistor N1 has: a source connected to the second power supply terminal 12; a drain connected to the power supply output terminal 13; a gate connected to a second switch control signal SW2 that is an output signal from the second switch control circuit 3; and a backgate connected to the selected lower voltage VOL. Here, the PMOS transistor P1 and the NMOS transistor N1 are MOS transistors having a breakdown voltage of 1.8 V, i.e., transistors are required to satisfy a bias condition under which, even if any two of the four terminals are selected, a potential difference between the two terminals is equal to or less than 1.8 V (a 1.8-V breakdown voltage condition).

The first switch control circuit 2 includes a first level shifter L1 externally receiving an output enable signal OE with 0 V/1.8 V and an input signal IN with 0 V/0.9 V and supplying the first switch control signal SW1. The first level shifter L1 is comprised of a previous-stage level shifter LV11 with the second power supply voltage VDD2 and a ground potential VSS as its power supply, and a subsequent-stage level shifter LV21 with the selected higher voltage VOH and the selected lower voltage VOL as its power supply. That is to say, the first level shifter L1 converts, in the previous-stage level shifter LV11, the input signal IN having an amplitude ranging from the VSS (0 V) level to the VDD (0.9 V) level into a signal having an amplitude ranging from the VSS (0 V) level to the VDD2 (1.8 V) level. The first level shifter L1 further converts, in the subsequent-stage level shifter LV21, the output signal from the previous-stage level shifter LV11 into the first switch control signal SW1 having an amplitude ranging from the selected lower voltage VOL to the selected higher voltage VOH.

The second switch control circuit 3 includes a second level shifter L2 externally receiving an output enable signal OE with 0 V/1.8 V and an input signal IN with 0 V/0.9 V and supplying the second switch control signal SW2. The second level shifter L2 is comprised of a previous-stage level shifter LV12 with the second power supply voltage VDD2 and a ground potential VSS as its power supply, and a subsequent-stage level shifter LV22 with the selected higher voltage VOH and the selected lower voltage VOL as its power supply. That is to say, the second level shifter L2 converts, in the previous-stage level shifter LV12, the input signal IN having an amplitude ranging from the VSS (0 V) level to the VDD (0.9 V) level into a signal having an amplitude ranging from the VSS (0 V) level to the VDD2 (1.8 V) level. The second level shifter L2 further converts, in the subsequent-stage level shifter LV22, the output signal from the previous-stage level shifter LV12 into the second switch control signal SW2 having an amplitude ranging from the selected lower voltage VOL to the selected higher voltage VOH.

Figure 2:
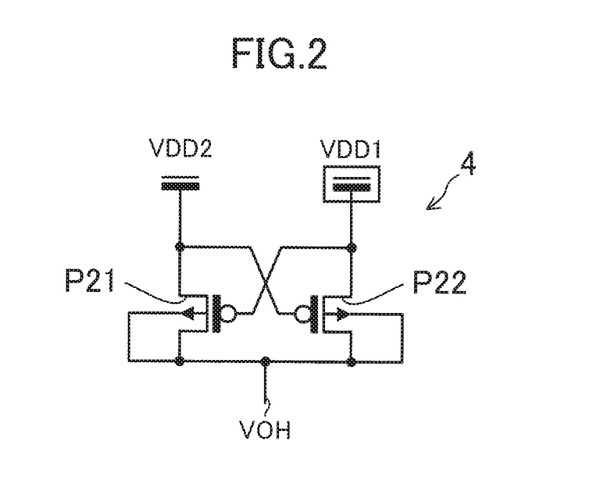
FIG. 2 is a circuit diagram showing a voltage selector selecting a higher one of a first power supply voltage or a second power supply voltage in FIG. 1.

FIG. 2 is a circuit diagram showing a first voltage selector 4 supplying the selected higher voltage VOH. The first voltage selector 4 has a first PMOS transistor P21 and a second PMOS transistor P22. The first PMOS transistor P21 has: a source connected to the second power supply voltage VDD2; a drain connected to the selected higher voltage VOH; a gate connected to the first power supply voltage VDD1; and a backgate connected to the selected higher voltage VOH. The second PMOS transistor P22 has: a source connected to the first power supply voltage VDD1; a drain connected to the selected higher voltage VOH; a gate connected to the second power supply voltage VDD2; and a backgate connected to the selected higher voltage VOH. Each of the first and second PMOS transistors P21 and P22 is an MOS transistor having a breakdown voltage of 1.8 V.

According to the first voltage selector 4 shown in FIG. 2, when the VDD1 is 0 V and the VDD2 is 1.8 V, the first PMOS transistor P21 turns on and the second PMOS transistor P22 turns off. Thus, the VOH and the VDD2 are 1.8 V. When the VDD1 is 3.3 V and the VDD2 is 1.8 V, the first PMOS transistor P21 turns off and the second PMOS transistor P22 turns on. Thus, the VOH and the VDD1 are 3.3 V. That is to say, the first voltage selector 4 selects a higher one of the first power supply voltage VDD1 or the second power supply voltage VDD2 as a selected higher voltage VOH.

Figure 3:
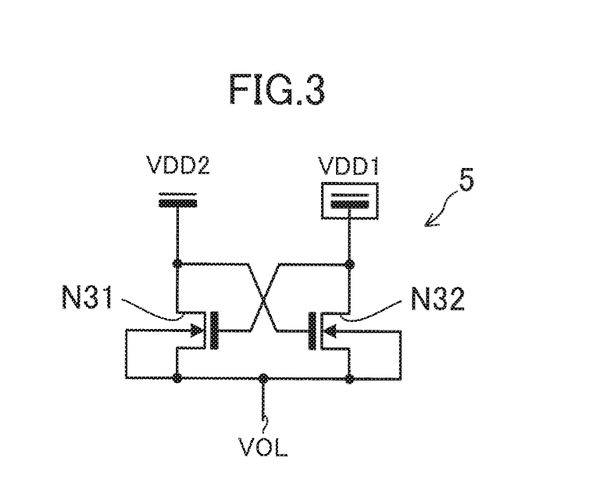
FIG. 3 is a circuit diagram showing a voltage selector selecting a lower one of the first power supply voltage or the second power supply voltage in FIG. 1.

FIG. 3 is a circuit diagram showing a second voltage selector 5 supplying selected lower voltage VOL. The second voltage selector 5 includes a first NMOS transistor N31 and a second NMOS transistor N32. The first NMOS transistor N31 has: a source connected to the second power supply voltage VDD2; a drain connected to the selected lower voltage VOL; a gate connected to the first power supply voltage VDD1; and a backgate connected to the selected lower voltage VOL. The second NMOS transistor N32 has: a source connected to the first power supply voltage VDD1; a drain connected to the selected lower voltage VOL; a gate connected to the second power supply voltage VDD2; and a backgate connected to the selected lower voltage VOL. Each of the first and second NMOS transistors N31 and N32 is an MOS transistor having a breakdown voltage of 1.8 V.

According to the second voltage selector 5 shown in FIG. 3, when the VDD1 is 0 V and the VDD2 is 1.8 V, the first NMOS transistor N31 turns off and the second. NMOS transistor N32 turns on. Thus, the VOL and the VDD1 are 0 V. When the VDD1 is 3.3 V and the VDD2 is 1.8 V, the first NMOS transistor N31 turns on and the second NMOS transistor N32 turns off. Thus, the VOL and the VDD2 are 1.8 V. That is to say, the second voltage selector 5 selects a lower one of the first power supply voltage VDD1 or the second power supply voltage VDD2 as a selected lower voltage VOL.

As can be seen, according to the first and second voltage selectors 4 and 5, when the VDD1 is 0 V and the VDD2 is 1.8 V, the VOH is 1.8 V and the VOL is 0 V. When the VDD1 is 3.3 V and the VDD2 is 1.8 V, the VOH is 3.3 V and the VOL is 1.8 V.

Figure 4:
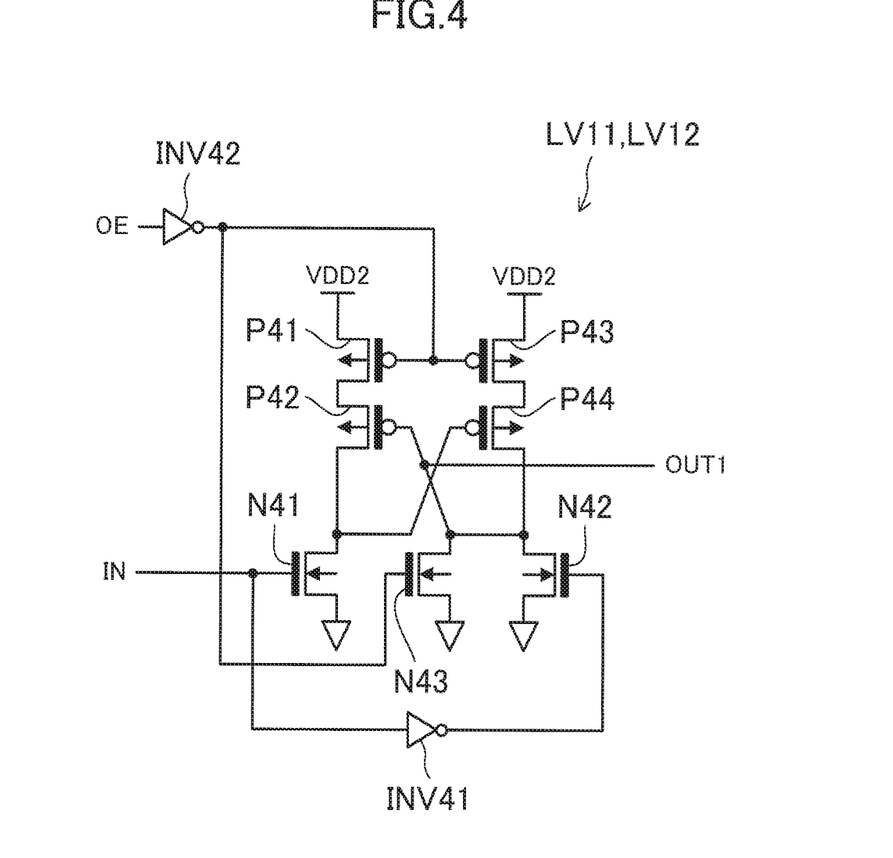
FIG. 4 is a circuit diagram of previous-stage level shifters in each switch control circuit in FIG. 1.

FIG. 4 is a circuit diagram of the previous-stage level shifters LV11 and LV12 in each of the switch control circuits 2 and 3 in FIG. 1. FIG. 4 shows a level shifter generating an output signal OUT1 to the subsequent-stage level shifters LV21 and LV22 by receiving the input signal IN, the output enable signal OE, and the second power supply voltage VDD2. The level shifter has first, second third, and fourth PMOS transistors P41, P42, P43, and P44, first, second, and third NMOS transistors N41, N42, and N43, and first and second inverters INV41 and INV42. These transistors are configured as only MOS transistors having a breakdown voltage of 1.8 V. The first inverter INV41 inverts the logic level of the input signal IN, and the second inverter INV42 inverts the logic level of the output enable signal OE. The first PMOS transistor P41 has: a source connected to the second power supply voltage VDD2; a drain connected to the source of the second PMOS transistor P42; and a gate connected to the output signal of the second inverter INV42 and the gate of the third PMOS transistor P43. The second PMOS transistor P42 has: a drain connected to the gate of the fourth PMOS transistor P44 and the drain of the first NMOS transistor N41; and a gate connected to the output signal OUT1, the drain of the fourth PMOS transistor P44, the drain of the second NMOS transistor N42, and the drain of the third NMOS transistor N43. The third PMOS transistor P43 has: a source connected to the second power supply voltage VDD2, and a drain connected to the source of the fourth PMOS transistor P44. The first NMOS transistor N41 has: a source connected to the ground potential; and a gate connected to the input signal IN. The second NMOS transistor N42 has: a source connected to the ground potential; and a gate connected to the output signal from the first inverter INV41. The third NMOS transistor N43 has: a source connected to the ground potential; and a gate connected to the output signal of the second inverter INV42.

According to the configuration of FIG. 4, when the output enable signal OE is low, the output signal from the second inverter INV42 becomes high, and first and third PMOS transistors P41 and P43 turn off and the third NMOS transistor N43 turns on. Thus, regardless of the logic level of the input signal IN, the output signal OUT1 is fixed to be low (0 V).

Next, in FIG. 4, an operation in a situation where the output enable signal OE is high and the input signal IN is high (0.9 V) will be described. Since the output enable signal OE is high, the output signal of the second inverter INV42 becomes low. Thus, the first and third PMOS transistors P41 and P43 turn on, and the third NMOS transistor N43 turns off. In contrast, since the input signal IN is high, the first NMOS transistor N41 and the fourth PMOS transistor P44 turn on, and the second NMOS transistor N42 and the second PMOS transistor P42 turn off. As a result, the output signal OUT1 becomes high (1.8 V).

Finally, in FIG. 4, an operation in a situation where the output enable signal OE is high and the input signal IN is low (0 V) will be described. Since the output enable signal OE is high, the output signal of the second inverter INV42 becomes low. Thus, the first and third PMOS transistors P41 and P43 turn on, and the third NMOS transistor N43 turns off. In contrast, since the input signal IN is low, the first NMOS transistor N41 and the fourth PMOS transistor P44 turn off, and the second NMOS transistor N42 and the second PMOS transistor P42 turn on. As a result, the output signal OUT1 becomes low (0 V).

As can be seen, according to the configuration of FIG. 4, each level shifter, while being controlled by the output enable signal OE, receives the input signal IN having a 0.9-V amplitude to obtain the output signal OUT1 having the same logic level as the input signal IN and having a 1.8-V amplitude.

Figure 5:
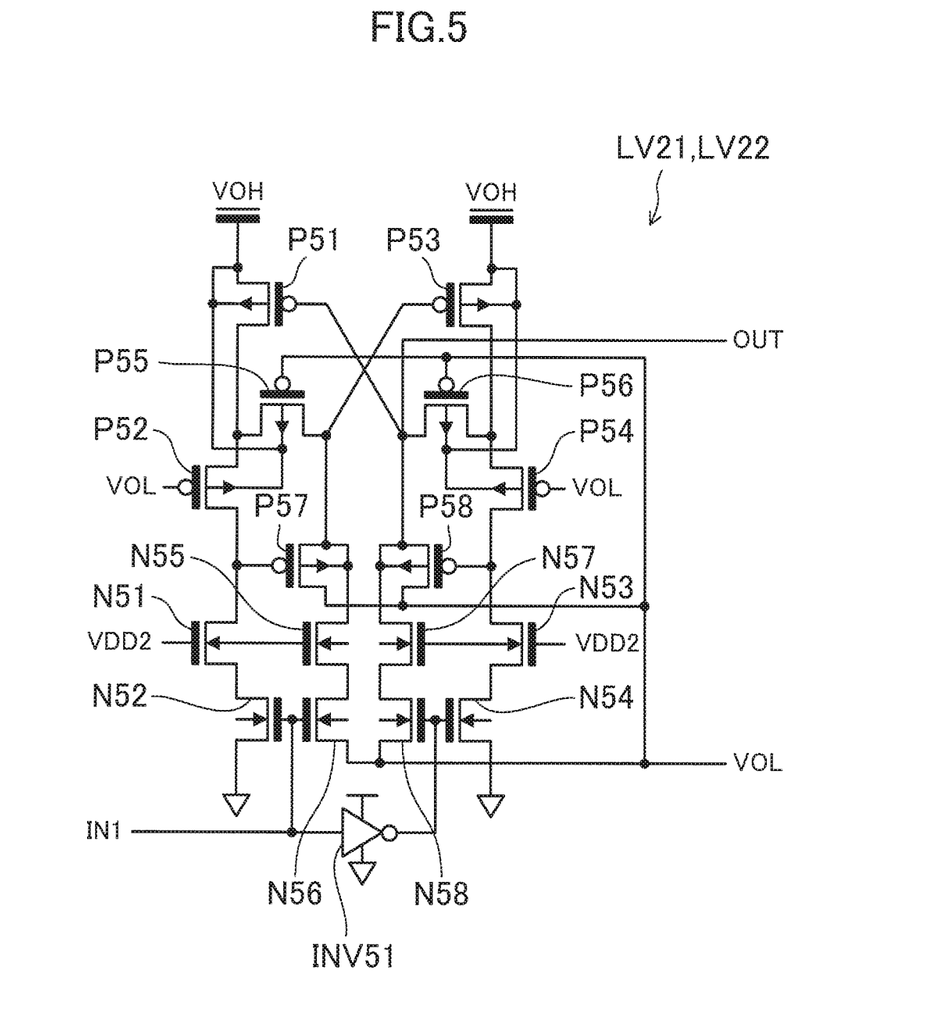
FIG. 5 is a circuit diagram of subsequent-stage level shifters in each switch control circuit in FIG. 1.

FIG. 5 is a circuit diagram of the subsequent-stage level shifters LV21 and LV22 in each of the switch control circuits 2 and 3 in FIG. 1. FIG. 5 shows the level shifters receiving the output signal OUT1 of the previous-stage level shifters LV11 and LV12 as an input signal IN1, receiving the second power supply voltage VDD2, the selected higher voltage VOH, and the selected lower voltage VOL, and generating an output signal OUT as the first and second switch control signals SW1 and SW2. The level shifters have first, second, third, fourth, fifth, sixth, seventh, and eighth PMOS transistors P51, P52, P53, P54, P55, P56, P57, and P58, and first, second, third, fourth, fifth, sixth, seventh, and eighth NMOS transistors N51, N52, N53, N54, N55, N56, N57, and N58, and an inverter INV51. These transistors are configured as only MOS transistors having a breakdown voltage of 1.8 V. The inverter INV51 inverts the logic level of the input signal IN1. The first PMOS transistor P51 has: a source connected to the selected higher voltage VOH, its backgate, the backgate of the second PMOS transistor P52, and the backgate of the fifth PMOS transistor P55; a drain connected to the source of the second PMOS transistor P52 and the drain of the fifth PMOS transistor P55; and a gate connected to the output signal OUT, the source of the sixth PMOS transistor P56, the source and backgate of the eighth PMOS transistor P58, and the drain of the seventh NMOS transistor N57. The second PMOS transistor P52 has: a drain connected to the gate of the seventh PMOS transistor P57 and the drain of the first NMOS transistor N51; and a gate connected to the selected lower voltage VOL. The third PMOS transistor P53 has: a source connected to the selected higher voltage VOH, its backgate, the backgate of the fourth PMOS transistor P54, and the backgate of the sixth PMOS transistor P56; a drain connected to the source of the fourth PMOS transistor P54 and the drain of the sixth PMOS transistor P56; and a gate connected to the source of the fifth PMOS transistor P55, the source and backgate of the seventh PMOS transistor P57, and the drain of the fifth NMOS transistor N55. The fourth PMOS transistor P54 has: a drain connected to the gate of the eighth PMOS transistor P58 and the drain of the third NMOS transistor N53; and a gate of the selected lower voltage VOL. The gate of the fifth PMOS transistor P55 and the gate of the sixth PMOS transistor P56 are connected to the selected lower voltage VOL. The drain of the seventh PMOS transistor P57 and the drain of the eighth PMOS transistor P58 are also connected to the selected lower voltage VOL. The first NMOS transistor N51 has: a source connected to the drain of the second NMOS transistor N52; and a gate connected to the second power supply voltage VDD2. The second NMOS transistor N52 has: a source connected to the ground potential; and a gate connected to the input signal IN1 and the gate of the sixth NMOS transistor N56. The third NMOS transistor N53 has: a source connected to the drain of the fourth NMOS transistor N54; and a gate connected to the second power supply voltage VDD2. The fourth NMOS transistor N54 has: a source connected to the ground potential; and a gate connected to the output signal of the inverter INV51 and the gate of the eighth NMOS transistor N58. The fifth NMOS transistor N55 has: a source connected to the drain of the sixth NMOS transistor N56; and a gate connected to the second power supply voltage VDD2. The sixth NMOS transistor N56 has a source connected to the selected lower voltage VOL. The seventh NMOS transistor N57 has: a source connected to the drain of the eighth NMOS transistor N58; and a gate connected to the second power supply voltage VDD2. The eighth NMOS transistor N58 has a source connected to the selected lower voltage VOL.

In FIG. 5, when the input signal IN1 is high (1.8 V) in a situation where the VOH is 1.8 V and the VOL is 0 V, the third PMOS transistor P53, the fourth PMOS transistor P54, the sixth PMOS transistor P56, the seventh PMOS transistor P57, the first NMOS transistor N51, the second NMOS transistor N52, the fifth NMOS transistor N55, and the sixth NMOS transistor N56 turn on, and the first PMOS transistor P51, the second PMOS transistor P52, the fifth PMOS transistor P55, the eighth PMOS transistor P58, the third NMOS transistor N53, the fourth NMOS transistor N54, the seventh NMOS transistor N57, and the eighth NMOS transistor N58 turn off. As a result, the output signal OUT becomes high (1.8 V).

In FIG. 5, when the input signal IN1 is low (0 V) in a situation where the VOH is 1.8 V and the VOL is 0 V, the first PMOS transistor P51, the second PMOS transistor P52, the fifth PMOS transistor P55, the PMOS transistor P58, the third NMOS transistor N53, the fourth NMOS transistor N54, the seventh NMOS transistor N57, and the eighth NMOS transistor N58 turn on, and the third PMOS transistor P53, the fourth PMOS transistor P54, the sixth PMOS transistor P56, the seventh PMOS transistor P57, the first NMOS transistor N51, the second NMOS transistor N52, the fifth NMOS transistor N55, and the sixth NMOS transistor N56 turn off. As a result, the output signal OUT becomes low (0 V).

In FIG. 5, when the input signal IN1 is high (1.8 V) in a situation where the VOH is 3.3 V and the VOL is 1.8 V, the third PMOS transistor P53, the fourth PMOS transistor P54, the sixth PMOS transistor P56, the seventh PMOS transistor P57, the first NMOS transistor N51, the second NMOS transistor N52, the fifth NMOS transistor N55, and the sixth NMOS transistor N56 turn on, and the first PMOS transistor P51, the second PMOS transistor P52, the fifth PMOS transistor P55, the eighth PMOS transistor P58, the third NMOS transistor N53, the fourth NMOS transistor N54, the seventh NMOS transistor N57, and the eighth NMOS transistor N58 turn off. As a result, the output signal OUT becomes high (3.3 V). Finally, in FIG. 5, when the input signal IN1 is low (0 V) in a situation where the VOH is 3.3 V and the VOL is 1.8 V, the first PMOS transistor P51, the second PMOS transistor P52, the fifth PMOS transistor P55, the eighth PMOS transistor P58, the third NMOS transistor N53, the fourth NMOS transistor N54, the seventh NMOS transistor N57, and the eighth NMOS transistor N58 turn on, and the third PMOS transistor P53, the fourth PMOS transistor P54, the sixth PMOS transistor P56, the seventh PMOS transistor P57, the first NMOS transistor N51, the second NMOS transistor N52, the fifth NMOS transistor N55, and the sixth NMOS transistor N56 turn off. As a result, the output signal OUT becomes low (1.8 V).

Figure 6:
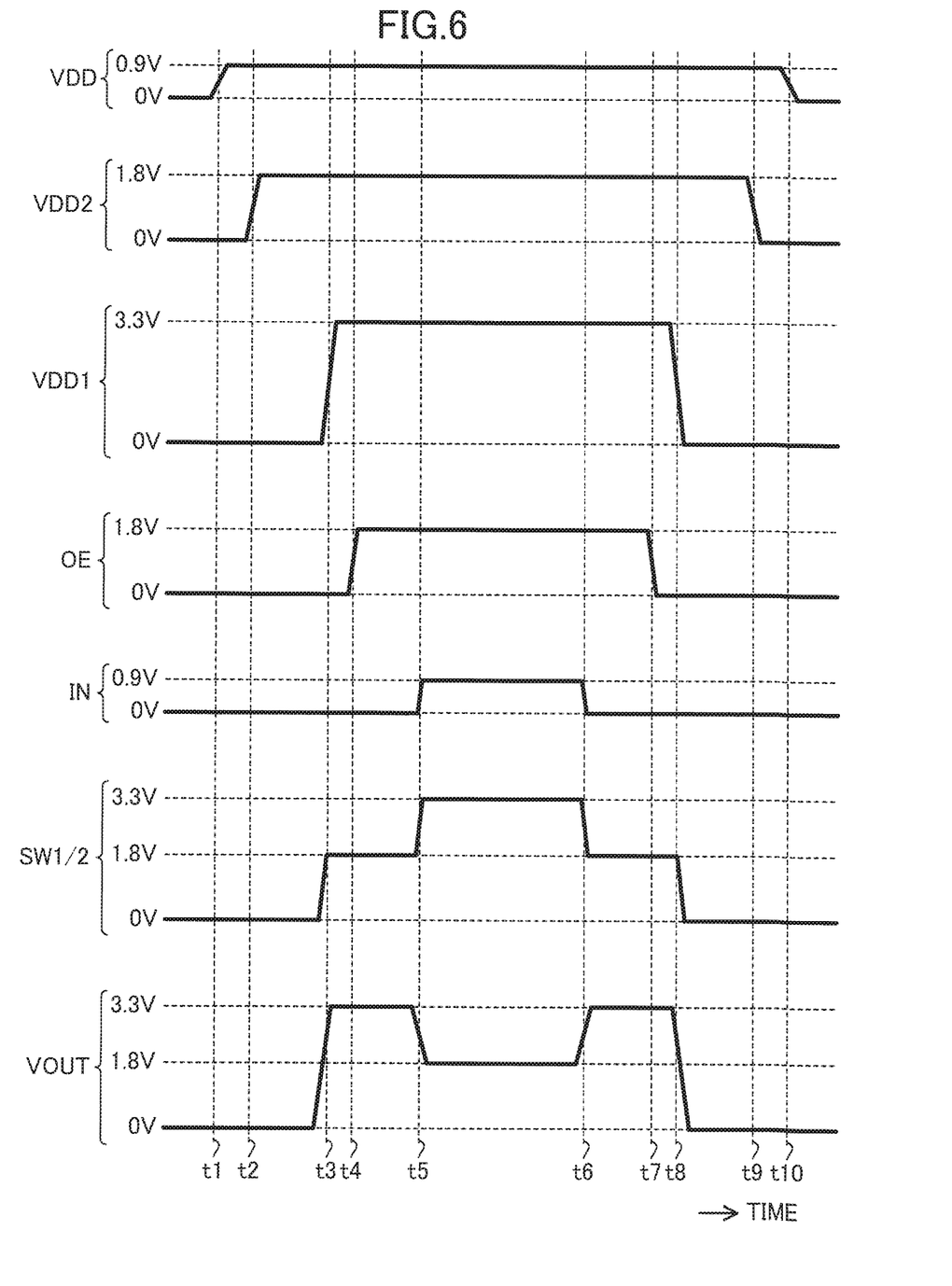
FIG. 6 is a timing diagram showing the operation of the semiconductor integrated circuit of FIG. 1.

FIG. 6 is a timing diagram showing the operation of the semiconductor integrated circuit of FIG. 1, in an initial state prior to time t1, all the internal power supply voltage VDD, the second power supply voltage VDD2, the first power supply voltage VDD1, the output enable signal OE, the input signal IN, the first switch control signal SW1, the second switch control signal SW2, the power supply voltage output VOUT are 0 V.

The internal power supply voltage VDD rises at time t1. Then, the operation has become ready to supply the first and second switch control circuits 2 and 3 with the input signal IN.

The second power supply voltage VDD2 rises at time t2. As a result, the VOH is 1.8 V, and the VOL is 0 V. Since the OE is low (0 V), the first and second switch control signals SW1 and SW2 are still 0 V. At that time, the PMOS transistor P1 is in on-state and the NMOS transistor N1 is in off-state, the VOUT is still 0 V. The source, drain, gate, and backgate of the PMOS transistor P1 respectively have voltages of 0 V, 0 V, 0 V, and 1.8 V. The source, drain, gate, and backgate of the NMOS transistor N1 respectively have voltages of 1.8 V, 0 V, 0 V, and 0 V. Therefore, the PMOS transistor P1 and the NMOS transistor N1 both satisfy the 1.8-V breakdown voltage condition. In addition, the NMOS transistor N1 reliably keeps its off-state when power is only supplied from one of the power supplies. Thus, even if no special through-current preventing circuit is provided, no through-current flows from the second power supply term 12 toward the first power supply terminal 11.

The first power supply voltage VDD1 rises at time t3. As a result, the VOH is change to 3.3 V and the VOL is change to 1.8 V. Although the OE is still low (0 V), the selected higher voltage VOH and the selected lower voltage VOL vary in the subsequent-stage level shifter LV21 and LV22, and thus, the voltages of both the first and second switch control signals SW1 and SW2 is change to 1.8 V. At this time, the PMOS transistor P1 is in on-state, and the NMOS transistor N1 is in off-state. Thus, the VOUT is changed to 3.3 V. The source, drain, gate, and backgate of the PMOS transistor P1 respectively have voltages of 3.3 V, 3.3 V, 1.8 V, and 3.3 V. The source, drain, gate, and backgate of the NMOS transistor N1 respectively have voltages of 1.8 V, 3.3 V, 1.8 V, and 1.8 V. Therefore, the PMOS transistor P1 and the NMOS transistor N1 both satisfy the 1.8-V breakdown voltage condition.

The output enable signal OE rises at time t4. The IN is still 0 V, other signals do not vary.

The input signal IN rises at time t5. As a result, the voltages of the first and second switch control signal SW1 and SW2 both is change to 3.3 V. At this time, the PMOS transistor P1 turns off, and the NMOS transistor N1 turns on. Thus, the VOUT is 1.8 V. The source, drain, gate, and backgate of the PMOS transistor P1 respectively have voltages of 3.3 V, 1.8 V, 3.3 V, and 3.3 V. The source, drain, gate, and backgate of the NMOS transistor N1 respectively have voltages of 1.8 V, 1.8 V, 3.3 V, and 1.8 V. Therefore, the PMOS transistor P1 and the NMOS transistor N1 both satisfy the 1.8-V breakdown voltage condition.

The input signal IN falls at time t6. The output enable signal OE falls at time t7. The first power supply voltage VDD1 falls at time t8. The second power supply voltage VDD2 falls at time t9. The internal power supply voltage VDD falls at time t10. As a result, the state returns to the initial state.

Figure 7:
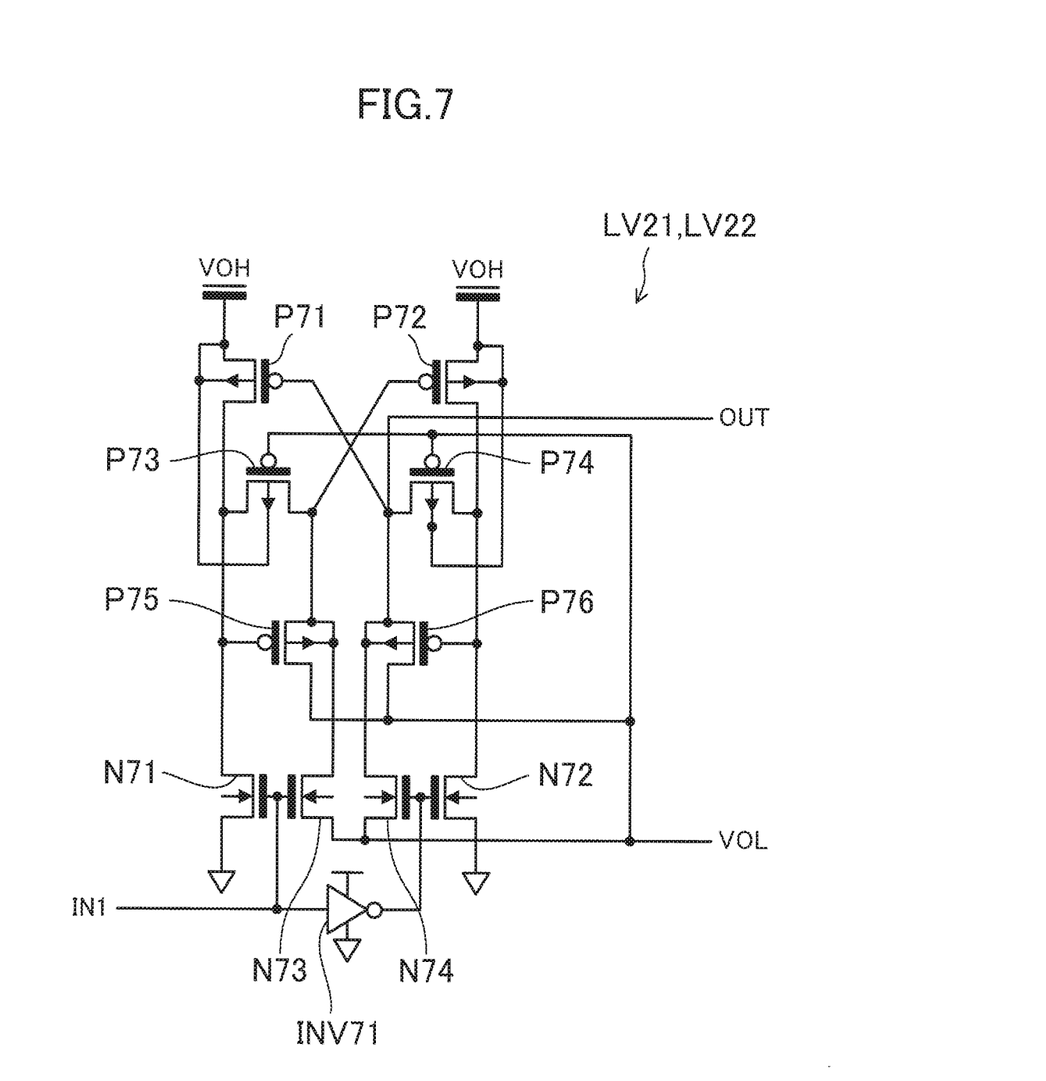
FIG. 7 is a circuit diagram showing a modification of FIG. 5.

FIG. 7 is a circuit diagram showing a modification of FIG. 5. FIG. 7 shows the level shifters receiving the output signal OUT1 of the previous-stage level shifters LV11 and LV12 as the input signal IN1, receiving the selected higher voltage VOH and the selected lower voltage VOL, and generating an output signal OUT as the first and second switch control signals SW1 and SW2. The level shifters have first, second, third, fourth, fifth, and sixth PMOS transistors P71, P72, P73, P74, P75, and P76, first, second, third and fourth NMOS transistors N71, N72, N73, and N74, and the inverter INV71. Of these transistors, the fifth PMOS transistor P75, the sixth PMOS transistor P76, and the inverter INV71 are configured as MOS transistors having a breakdown voltage of 1.8 V. The first to fourth PMOS transistors P71 to P74 and the first to fourth NMOS transistors N71 to N74 are laterally diffused (LD) MOS transistors. Here, the LDMOS transistor means a MOS transistor in which a 3.3 V voltage can be applied between its source and its drain, between its gate and its drain, and between its backgate and its drain, and which needs to satisfy the 1.8-V breakdown voltage condition between other terminals.

The inverter INV71 inverts the logic level of the input signal IN1. The first PMOS transistor P71 has: a source connected to the selected higher voltage VOH, its backgate, and the backgate of the third PMOS transistor P73; a drain connected to the drain of the third PMOS transistor P73, the gate of the fifth PMOS transistor P75, and the drain of the first NMOS transistor N71; and a gate connected to the output signal OUT, the source of the fourth PMOS transistor P74, the source and backgate of the sixth PMOS transistor P76, and the drain of the fourth NMOS transistor N74. The second PMOS transistor P72 has: a source connected to the selected higher voltage VOH, its backgate, and the backgate of the fourth PMOS transistor P74; a drain connected to the drain of the fourth PMOS transistor P74, the gate of the sixth PMOS transistor P76, and the drain of the second NMOS transistor N72; and a gate connected to the source of the second PMOS transistor P72, the source and backgate of the fifth PMOS transistor P75, and the drain of the third NMOS transistor N73. The third PMOS transistor P73 and the fourth PMOS transistor P74 each have a gate connected to the selected lower voltage VOL. The fifth PMOS transistor P75 and the drain of the sixth PMOS transistor P76 each have a drain connected to the selected lower voltage VOL, too. The first NMOS transistor N71 has: a source connected to the ground potential; and a gate connected to the input signal IN1 and the gate of the third NMOS transistor N73. The second NMOS transistor N72 has: a source connected to the ground potential; and a gate connected to the output signal of the inverter INV71 and the gate of the gate of the fourth NMOS transistor N74. The third NMOS transistor N73 and the fourth NMOS transistor N74 each have a source connected to the selected lower voltage VOL.

In FIG. 7, when the input signal IN1 is high (1.8 V) in a situation where the VOH is 1.8 V and the VOL is 0 V, the second PMOS transistor P72, the fourth PMOS transistor P74, the fifth PMOS transistor P75, the first NMOS transistor N71, and the third NMOS transistor N73 turn on, and the first PMOS transistor P71, the third PMOS transistor P73, the sixth PMOS transistor P76, the second NMOS transistor N72, and the fourth NMOS transistor N74 turn off. As a result, the output signal OUT becomes high (1.8 V).

In FIG. 7, when the input signal IN1 is low (0 V) in a situation where the VOH is 1.8 V and the VOL is 0 V, the first PMOS transistor P71, the third PMOS transistor P73, the sixth PMOS transistor P76, the second NMOS transistor N72, and the fourth NMOS transistor N74 turn on, the second PMOS transistor P72, the fourth PMOS transistor P74, the fifth PMOS transistor P75, the first NMOS transistor N71, and the third NMOS transistor N73 turn off. As a result, the output signal OUT becomes low (0 V).

In FIG. 7, when the input signal IN1 is high (1.8 V) in a situation where the VOH is 3.3 V and the VOL is 1.8 V, the output signal OUT is high (3.3 V). At that time, the second PMOS transistor P72, the fourth PMOS transistor P74, the fifth PMOS transistor P75, the first NMOS transistor N71, and the third NMOS transistor N73 turn on, and the first PMOS transistor P71, the third PMOS transistor P73, the sixth PMOS transistor P76, the second NMOS transistor N72, and the fourth NMOS transistor N74 turn off. Of these transistors, the voltage between the gate and drain of the first PMOS transistor P71, the voltage between the backgate and drain of the third PMOS transistor P73, the voltage between the gate and drain of the second NMOS transistor N72, and the voltage between the gate and drain of the fourth NMOS transistor N74 are 3.3 V. However, these transistors are the LDMOS transistors, and thus, no breakdown voltage problem is caused.

Finally, in FIG. 7, when the input signal IN1 is low (0 V) in a situation where the VOH is 3.3 V and the VOL is 1.8 V, the output signal OUT is low (1.8 V). At that time, the first PMOS transistor P71, the third PMOS transistor P73, the sixth PMOS transistor P76, the second NMOS transistor N72, and the fourth NMOS transistor N74 turn on, and the second PMOS transistor P72, the fourth PMOS transistor P74, the fifth PMOS transistor P75, the first NMOS transistor N71, and the third NMOS transistor N73 turn off. Of these transistors, the voltage between the gate and drain of the second PMOS transistor P72, the voltage between the backgate and drain of the fourth PMOS transistor P74, the voltage between the gate and drain of the first NMOS transistor N71, and the voltage between the gate and drain of the third NMOS transistor N73 are 3.3 V. However, these transistors are the LDMOS transistors, and thus, no breakdown voltage problem is caused.

According to the configuration of FIG. 7, the first to fourth PMOS transistors P71 to P74 and the first to fourth NMOS transistors N71 to N74 are the LDMOS transistors, implementing level shifters having a smaller circuit size than in a case where these transistors are 3.3 V breakdown voltage MOS transistors.

In FIG. 7, if each of the first PMOS transistor P71, the second PMOS transistor P72, and the first to fourth NMOS transistors N71 to N74 is replaced with two MOS transistors having a breakdown voltage of 1.8 V in cascode connection, and each of the third and fourth PMOS transistors P73 and P74 is replaced with one MOS transistor having a breakdown voltage of 1.8 V, the replaced configuration substantially corresponds to the configuration of FIG. 5.

Figure 8:
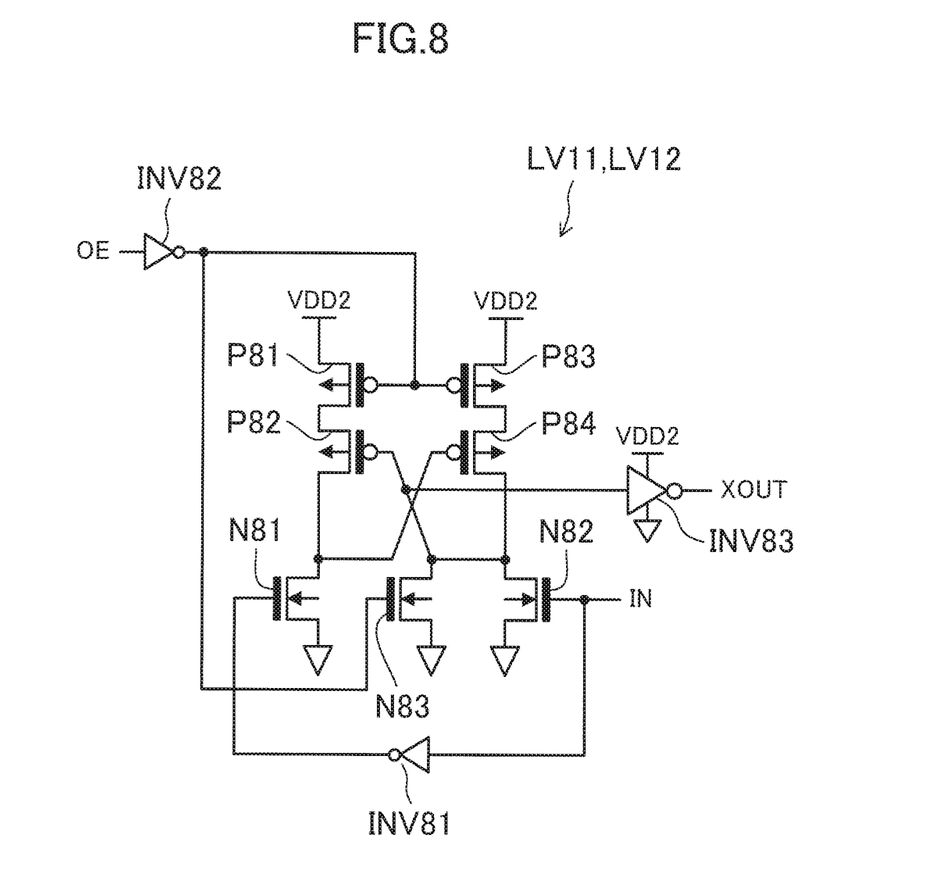
FIG. 8 is a circuit diagram showing a modification of FIG. 4.

FIG. 8 is a circuit diagram showing a modification of FIG. 4. In the configuration of FIG. 8, in addition to the output-stage that is same as or similar to the figuration of FIG. 4, i.e., first, second, third and fourth PMOS transistors P81, P82, P83, and P84, first, second, and third NMOS transistors N81, N82, and N83, and first and second inverters INV81 and INV82, a third inverter INV83 is added. These transistors are only MOS transistors having breakdown voltage of 1.8 V. The third inverter INV83 is connected to the second power supply voltage VDD2 and the ground potential, and outputs an output signal XOUT to the subsequent-stage level shifters LV21 and LV22.

According to the configuration of FIG. 8, when the output enable signal OE is low, the output signal XOUT is fixed to be high (1.8 V) regardless of the logic level of the input signal IN. If the output enable signal OE is high (1.8 V) and the input signal IN is high (0.9 V), the output signal XOUT becomes low (0 V). When the output enable signal OE is high (1.8 V) and the input signal IN is low (0 V), the output signal XOUT becomes high (1.8 V).

As can be seen, according to the configuration of FIG. 8, the level shifters, while being controlled by the output enable signal OE, receive the input signal IN having a 0.9-V amplitude to obtain the output signal XOUT having an inverted logic level with respect to the input signal IN and having a 1.8-V amplitude.

Changing the configuration of the previous-stage level shifter LV11 of the first switch control circuit 2 and the previous-stage level shifter LV12 of the second switch control circuit 3 which are shown in FIG. 1 from that in FIG. 4 to that in FIG. 8 can change the power supply voltage output VOUT in a situation where the output enable signal OE is low from the first power supply voltage VDD1 (3.3 V) to the second power supply voltage VDD2 (1.8 V).

Keeping the previous-stage level shifter LV12 of the second switch control circuit 3 in FIG. 1 has the configuration shown in FIG. 4 as it is, and changing the configuration of the previous-stage level shifter LV11 of the first switch control circuit 2 in FIG. 1 from that of FIG. 4 to that of FIG. 8 allow the PMOS transistor P1 and the NMOS transistor N1 to turn off in a situation where the output enable signal OE is low. The power supply voltage output VOUT can be a high impedance output.

As can be seen, according to the first embodiment, a power supply switch circuit which does not cause an unwanted current can be provided using only MOS transistors having a low-breakdown-voltage, i.e., MOS transistors having a breakdown voltage of 1.8 V or the LDMOS transistors, and the need for a special through-current preventing circuit can be eliminated.

Second Embodiment

Figure 9:
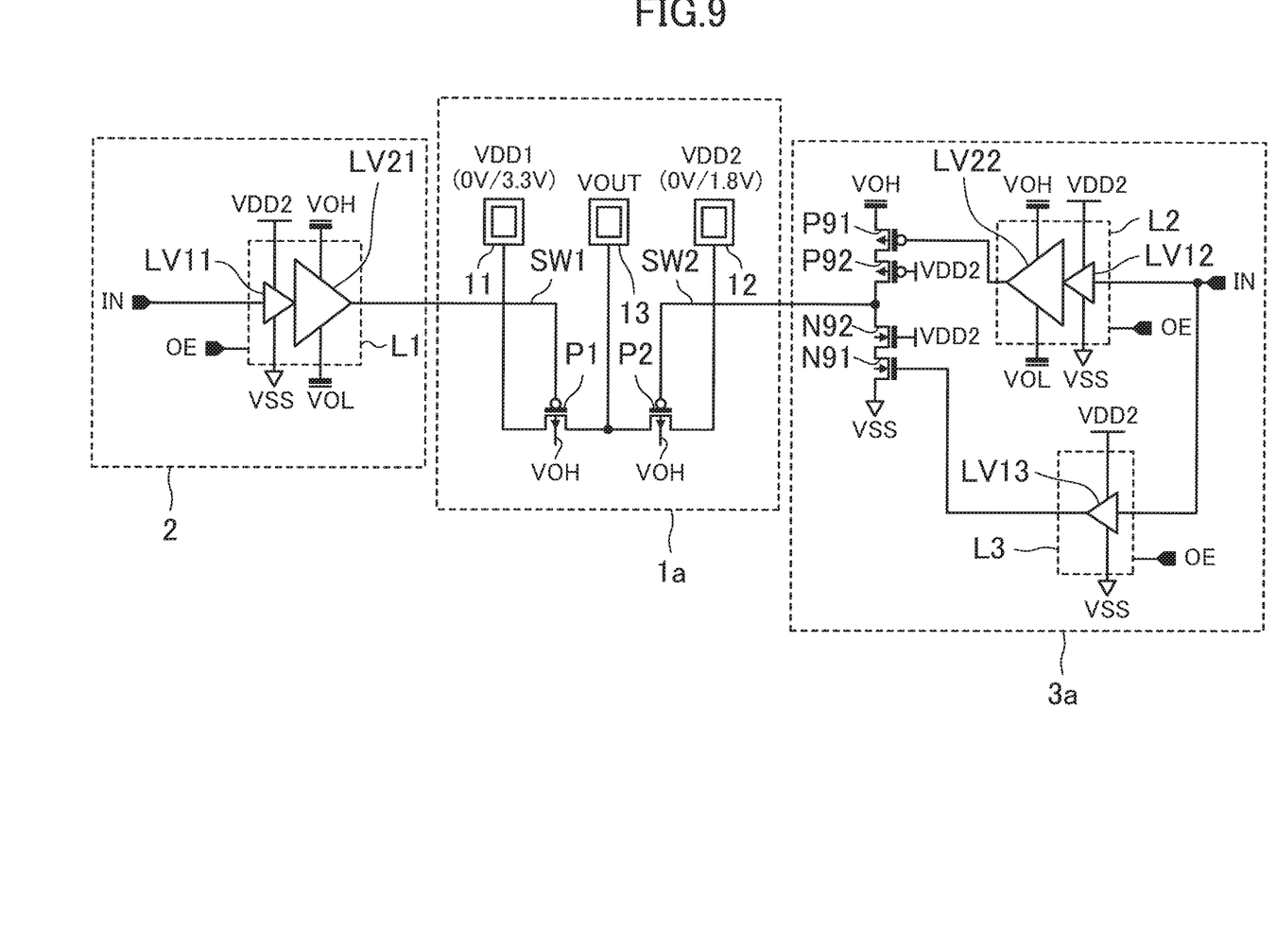
FIG. 9 is a circuit diagram showing a semiconductor integrated circuit according to a second embodiment.

FIG. 9 is a circuit diagram showing a semiconductor integrated circuit according to a second embodiment. The semiconductor integrated circuit of FIG. 9 includes a power supply switch circuit 1a, a first switch control circuit 2, and a second switch control circuit 3a.

The power supply switch circuit 1a in FIG. 9 is obtained by replacing the NMOS transistor N1 of the power supply switch circuit 1 in FIG. 1 with a PMOS transistor P2, reducing an electrostatic discharge (ESD) risk. In the following description, a PMOS transistor P1 disposed between a first power supply terminal 11 and a power supply output terminal 13 is referred to as "a first PMOS transistor," and a PMOS transistor P2 disposed between a second power supply terminal 12 and the power supply output terminal 13 is referred to as "a second PMOS transistor." The first and second PMOS transistors P1 and P2 each have a backgate connected to the selected higher voltage VOH.

The first switch control circuit 2 in FIG. 9 has a first level shifter L1 having the same or similar configuration as or to that in FIG. 1. The first level shifter L1 supplies the gate of the first PMOS transistor P1 with a first switch control signal SW1.

The second switch control circuit 3a in FIG. 9 has, in addition to a second level shifter L2 having the same or similar configuration to that in FIG. 1, a third level shifter L3, third and fourth PMOS transistors P91 and P92, and first and second NMOS transistors N91 and N92. The third level shifter L3 is comprised of a level shifter LV13 having the same as or similar configuration to the above previous-stage level shifters LV11 and LV12. The third level shifter L3 receives an output of 0 V/1.8 V, an output enable signal OE, and an input signal IN of 0 V/0.9 V to generate a signal of 0 V/1.8 V. The third PMOS transistor P91 has: a source connected to a selected higher voltage VOH; a drain connected to the source of the fourth PMOS transistor P92; and a gate connected to the output signal of the second level shifter L2. The fourth PMOS transistor P92 has: a drain connected to the drain of the second switch control signal SW2 and the drain of the second NMOS transistor N92; and a gate connected to a second power supply voltage VDD2. The first NMOS transistor N91 has: a source connected to a ground potential VSS; a drain connected to the source of the second NMOS transistor N92; and a gate connected to the output signal of the third level shifter L3. The gate of the second NMOS transistor N92 is connected to the second power supply voltage VDD2. The third and fourth PMOS transistors P91 and P92, and the first and second NMOS transistors N91 and N92 constitute an inverter configured to invert the logic level of the output signal of the second level shifter L2. That is to say, the second level shifter L2 in FIG. 9 supplies the gate of the second PMOS transistor P2 with a second switch control signal SW2 through the inverter.

Figure 10:
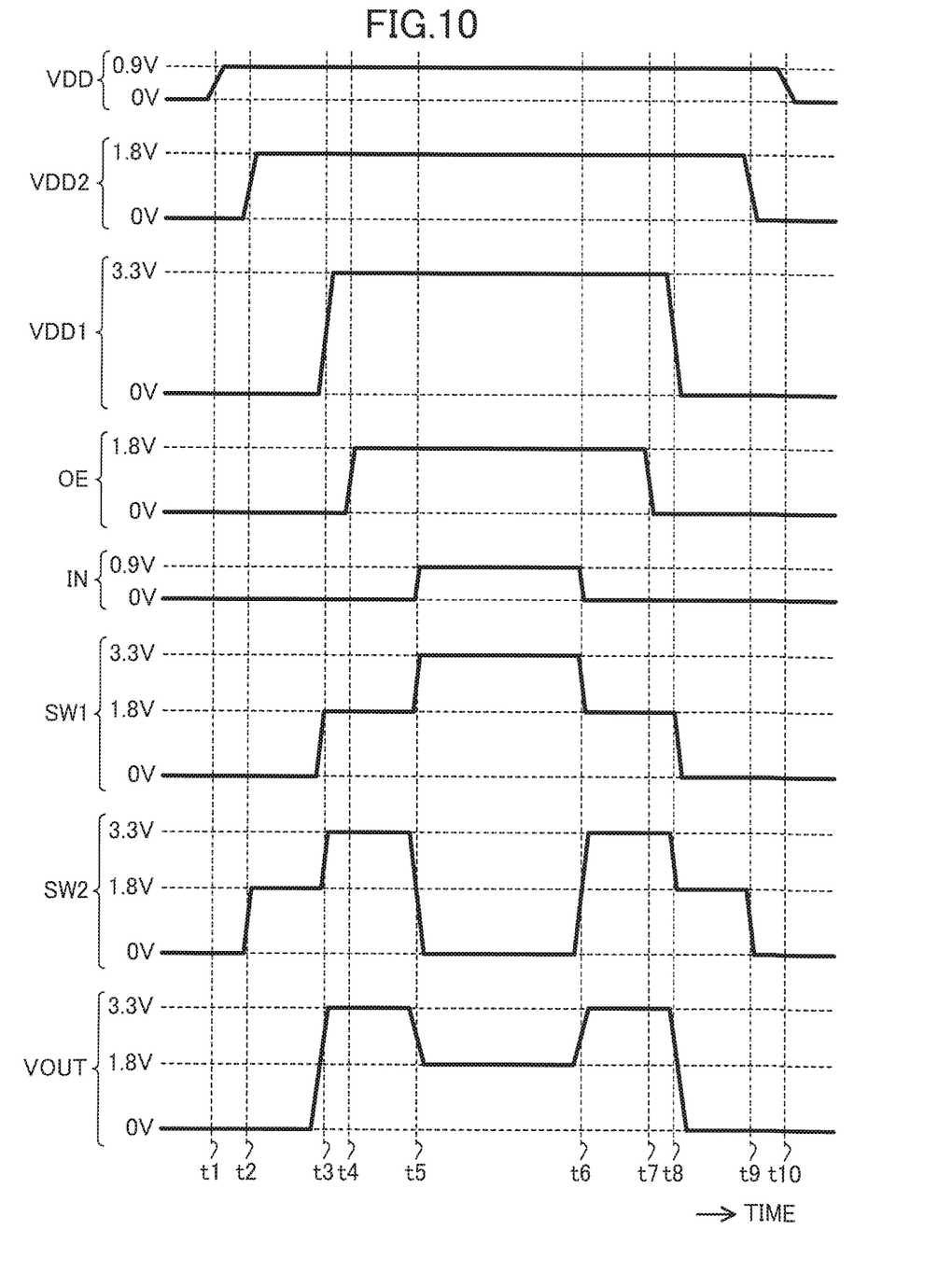
FIG. 10 is a timing diagram showing the operation of the semiconductor integrated circuit of FIG. 9.

FIG. 10 is a timing diagram showing the operation of the semiconductor integrated circuit of FIG. 9. The timing diagram in FIG. 10 is the same as in FIG. 6, except for the waveform of the second switch control signal SW2.

From time t2 to time t3 and from time t8 to time t9 in FIG. 10, the VDD1 is 0 V and the VDD2 is 1.8 V. Thus, the VOH is 1.8 V and the VOL is 0 V. In this case, the first switch control signal SW1 is low (0 V), and the second switch control signal SW2 is high (1.8 V). The VOUT is 0 V. At that time, the source, drain, gate, and backgate of the first PMOS transistor P1 respectively have voltages of 0 V, 0 V, 0 V, and 1.8 V. The source, drain, gate, and backgate of the second PMOS transistor P2 respectively have voltages of 1.8 V, 0 V, 1.8 V, and 1.8 V. Therefore, the first and second PMOS transistor P1 and P2 both satisfy the 1.8-V breakdown voltage condition. In addition, the second PMOS transistor P2 reliably keeps its off-state when power is only supplied from one side of the power supplies. Thus, even if no special through-current preventing circuit is provided, no through-current flows from the second power supply terminal 12 toward the first power supply terminal 11.

From time t3 to time t8 in FIG. 10, the VDD1 is 3.3 V and the VDD2 is 1.8 V. Thus, the VOH is 3.3 V and the VOL is 1.8 V. In this case, when the first switch control signal SW1 is low (1.8 V), the second switch control signal SW2 is high (3.3 V), and the VOUT is 3.3 V. At that time, the source, drain, gate, and backgate of the second PMOS transistor P2 respectively have voltages of 1.8 V, 3.3 V, 3.3 V, and 3.3 V, which satisfies the 1.8-V breakdown voltage condition. When the first switch control signal SW1 is high (3.3 V), the second switch control signal SW2 is low (0 V), and the VOUT is 1.8 V. At that time, the second PMOS transistor P2 is in on state, and the source, drain, gate, and backgate of the second PMOS transistor P2 respectively have voltages of 1.8 V, 1.8 V, 0 V, and 3.3 V, which satisfies the 1.8-V breakdown voltage condition, too.

If the LDMOS transistors are adopted as the third PMOS transistor P91 and the first NMOS transistor N91 in FIG. 9, the fourth PMOS transistor P92 and the second NMOS transistor N92 do not have to be disposed. In a situation where the VDD1 is 3.3 V and the VDD2 is 1.8 V, i.e., the VOH is 3.3 V and the VOL is 1.8 V, when the first NMOS transistor N91 is in off-state and the SW2 is 3.3 V, the voltage between the gate and the drain of the first NMOS transistor N91 is 3.3 V. Such a state causes no breakdown voltage problem because of using the LDMOS transistors. In a situation where the VOH is 3.3 V and the VOL is 1.8 V, when the third PMOS transistor P91 is in off-state and the SW2 is 0 V, the voltage between the source and drain of the third PMOS transistor P91 and the voltage between the gate and drain of the third PMOS transistor P91 are changed to 3.3 V. Such a state causes no breakdown voltage problem because of using the LDMOS transistors.

As can be seen, according to the second embodiment, a power supply switch circuit which does not cause an unwanted current can be also provided using only the MOS transistors having a low breakdown voltage, i.e., MOS transistors having a breakdown voltage of 1.8 V or the LDMOS transistors, and the need for a special through-current preventing circuit can be eliminated, too.

As can be seen from the foregoing description, the semiconductor integrated circuit according to the present disclosure provides a power supply switch circuit which does not cause an unwanted current using only MOS transistors having a low-breakdown-voltage, and has an advantage of capable of eliminating the need for a special through-current preventing circuit. The present disclosure is useful as, e.g., a semiconductor integrated circuit including a power supply switch circuit switching power supply voltages which are to be supplied.

What is claimed is:

1. A semiconductor integrated circuit, comprising:
a ground terminal to which a ground potential is applied;
a first power supply terminal to which a first power supply voltage is applied, the first power supply voltage having a voltage of a ground voltage level equal to the ground potential in off-state, and a voltage of a first power supply voltage level being higher than the ground potential in on-state;
a second power supply terminal to which a second power supply voltage is applied, the second power supply voltage having the voltage of the ground voltage level in off-state, and a voltage of a second power supply voltage level being higher than the ground potential and lower than the first power supply voltage level in on-state;
a third power supply terminal through which the first power supply voltage applied to the first power supply terminal or the second power supply voltage applied to the second power supply terminal is output;
a first PMOS transistor which connects the first power supply terminal and the third power supply terminal together;
a second PMOS transistor which connects the second power supply terminal and the third power supply terminal together;
a first switch control circuit which is connected to the second power supply terminal and a gate of the first PMOS transistor; and
a second switch control circuit which is connected to a gate of the second PMOS transistor, wherein:
the first switch control circuit outputs a signal ranging from the ground voltage level to the second power supply voltage level when the first power supply voltage is in off-state and the second power supply voltage is in on-state, and a signal ranging from the second power supply voltage level to the first power supply voltage level when the first and second power supply voltages are in on-state, thereby allowing the first PMOS transistor to turn on or off, and
the second switch control circuit outputs a signal ranging from the ground voltage level to the second power supply voltage level when the first power supply voltage is in off-state and the second power supply voltage is in on-state, and a signal ranging from the ground voltage level to the first power supply voltage level when the first and second power supply voltages are in on-state, thereby allowing the second PMOS transistor to turn on or off.

2. The semiconductor integrated circuit of claim 1, further comprising:
a first voltage selector supplied with the first power supply voltage and the second power supply voltage, and outputting a higher one of the first power supply voltage or the second power supply voltage as a voltage of a selected higher voltage level,
wherein
the voltage of the selected higher voltage level output from the first voltage selector is applied to backgates of the first and second PMOS transistors.

3. The semiconductor integrated circuit of claim 2, further comprising:
a second voltage selector supplied with the first power supply voltage and the second power supply voltage, and outputting a lower one of the first power supply voltage or the second power supply voltage as a voltage of a selected lower voltage level, wherein:
the first switch control circuit includes a first level shifter, and the second switch control circuit includes a second level shifter, a third level shifter, and an inverter,
each of the first and second level shifter includes:
a previous-stage level shifter converting an input signal ranging from the ground voltage level to an internal power supply voltage level into a signal ranging from the ground voltage level to the second power supply voltage level, and outputting a converted signal, and a subsequent-stage level shifter converting the converted signal into a signal ranging from the selected lower voltage level output from the second voltage selector to the selected higher voltage level output from the first voltage selector, the third level shifter has a function of converting the input signal ranging from the ground voltage level to the internal power supply voltage level into a signal ranging from the ground voltage level to the second power supply voltage level, and outputting a converted signal, the inverter has a third PMOS transistor and a first NMOS transistor connected together in series between the voltage of the selected higher voltage level and the ground potential, and an output signal from the second level shifter is connected to a gate of the third PMOS transistor, and an output signal from the third level shifter is connected to a gate of the first NMOS transistor.

\* \* \* \* \*